(12) United States Patent
Romero

(10) Patent No.: US 11,927,650 B2
(45) Date of Patent: Mar. 12, 2024

(54) MAGNETIC-FIELD CLOSED-LOOP SENSORS WITH DIAGNOSTICS

(71) Applicant: Allegro MicroSystems, LLC, Manchester, NH (US)

(72) Inventor: Hernán D. Romero, Buenos Aires (AR)

(73) Assignee: Allegro MicroSystems, LLC, Manchester, NH (US)

( * ) Notice: Subject to any disclaimer, the term of this patent is extended or adjusted under 35 U.S.C. 154(b) by 214 days.

(21) Appl. No.: 17/659,515

(22) Filed: Apr. 18, 2022

(65) Prior Publication Data

US 2022/0236347 A1     Jul. 28, 2022

Related U.S. Application Data

(63) Continuation-in-part of application No. 17/140,429, filed on Jan. 4, 2021, now Pat. No. 11,555,872.

(51) Int. Cl.
*G01R 33/00*   (2006.01)
*G01R 33/09*   (2006.01)

(52) U.S. Cl.
CPC ......... *G01R 33/098* (2013.01); *G01R 33/091* (2013.01)

(58) Field of Classification Search
CPC .............................. G01R 33/098; G01R 33/091
See application file for complete search history.

(56) References Cited

U.S. PATENT DOCUMENTS

| | | |
|---|---|---|
| 5,594,173 A | 1/1997 | Frey et al. |
| 6,043,644 A | 3/2000 | de Coulon et al. |
| 7,705,586 B2 | 4/2010 | van Zon et al. |
| 7,800,389 B2 | 9/2010 | Friedrich et al. |
| 7,923,996 B2 | 4/2011 | Doogue et al. |
| 8,030,918 B2 | 10/2011 | Doogue et al. |

(Continued)

FOREIGN PATENT DOCUMENTS

| | | |
|---|---|---|
| EP | 1 797 496 B1 | 7/2009 |
| EP | 3 954 971 A1 | 2/2022 |

OTHER PUBLICATIONS

U.S. Appl. No. 18/176,745, filed Mar. 1, 2023, Romero.

(Continued)

*Primary Examiner* — Alesa Allgood
(74) *Attorney, Agent, or Firm* — DALY, CROWLEY, MOFFORD & DURKEE, LLP

(57) ABSTRACT

Magnetic-field sensors use magnetic closed-loops with magnetic-field sensing elements, e.g., magnetoresistance (MR) elements, and diagnostic circuitry operating in a separate frequency band than that used for magnetic field sensing. The MR elements can be used in a first stage of a high gain amplifier which provides a feedback signal to a feedback coil in a feedback configuration to provide a magnetic feedback field. The magnetic feedback field attenuates the sensed magnetic field so that the MR elements operate in a linear range. Magnetic stray field effects and any limited linearity of magnetic-field sensing elements can be masked by the loop gain of the closed loop. For a magnetic closed-loop, a negative feedback configuration can be used or a positive feedback configuration can be used with a loop-gain of less than one. The diagnostic signal traverses the closed-loop and provides information regarding correct or incorrect functioning of the loop components.

36 Claims, 7 Drawing Sheets

(56) References Cited

U.S. PATENT DOCUMENTS

| | | |
|---|---|---|
| 8,447,556 B2 | 5/2013 | Friedrich et al. |
| 8,542,010 B2 | 9/2013 | Cesaretti et al. |
| 8,680,846 B2 | 3/2014 | Cesaretti et al. |
| 8,692,546 B2 | 4/2014 | Cesaretti et al. |
| 8,818,749 B2 | 8/2014 | Friedrich et al. |
| 9,151,807 B2 | 10/2015 | Friedrich et al. |
| 10,310,028 B2 | 6/2019 | Latham et al. |
| 10,324,141 B2 | 6/2019 | Latham et al. |
| 10,444,299 B2 | 10/2019 | Romero et al. |
| 10,481,219 B2 | 11/2019 | Romero et al. |
| 10,613,158 B2 | 4/2020 | Cook et al. |
| 10,641,842 B2 | 5/2020 | Latham et al. |
| 10,763,219 B2 | 9/2020 | Almiron et al. |
| 10,837,943 B2 | 11/2020 | Romero |
| 10,917,092 B2 | 2/2021 | Romero |
| 10,996,289 B2 | 5/2021 | Latham et al. |
| 11,143,732 B2 | 10/2021 | Romero et al. |
| 11,262,422 B2 | 3/2022 | Romero |
| 11,555,872 B2 | 1/2023 | Romero |
| 2007/0247141 A1 | 10/2007 | Pastre et al. |
| 2009/0024889 A1 | 1/2009 | Forrest et al. |
| 2015/0022193 A1 | 1/2015 | Burdette et al. |
| 2015/0022198 A1 | 1/2015 | David et al. |
| 2016/0025820 A1 | 1/2016 | Scheller et al. |
| 2016/0139199 A1 | 5/2016 | Petrie et al. |
| 2018/0340986 A1 | 11/2018 | Latham et al. |
| 2018/0340989 A1 | 11/2018 | Latham et al. |
| 2019/0025346 A1 | 1/2019 | Latham |
| 2019/0079146 A1 | 3/2019 | Romero et al. |
| 2020/0022529 A1 | 1/2020 | Jalali et al. |
| 2020/0225298 A1* | 7/2020 | Latham .............. G01R 33/0094 |
| 2021/0181269 A1 | 6/2021 | Ishida et al. |
| 2022/0214410 A1 | 7/2022 | Romero |
| 2023/0027608 A1 | 1/2023 | Romero |

OTHER PUBLICATIONS

Extended European Search Report dated Oct. 28, 2022 for European Application No. 22172865.2; 8 Pages.
U.S. Notice of Allowance dated Jul. 29, 2022 for U.S. Appl. No. 17/140,429; 16 Pages.
Amendment under Rule 312 filed on Aug. 15, 2022 for U.S. Appl. No. 17/140,429; 5 Pages.
U.S. Notice of Allowance dated Feb. 6, 2023 for U.S. Appl. No. 17/937,556; 13 Pages.
U.S. Appl. No. 17/186,346, filed Feb. 26, 2021, Romero.
U.S. Non-Final Office Action dated Apr. 23, 2020 for U.S. Appl. No. 15/901,135; 17 pages.
Response to U.S. Non-Final Office Action dated Apr. 23, 2020 for U.S. Appl. No. 15/901,135; Response filed Jul. 17, 2020; 10 pages.
U.S. Final Office Action dated Sep. 3, 2020 for U.S. Appl. No. 15/901,135; 15 pages.
Response to U.S. Final Office Action dated Sep. 3, 2020 for U.S. Appl. No. 15/901,135; Response filed Nov. 23, 2020; 13 pages.
U.S. Non-Final Office Action dated Apr. 12, 2021 for U.S. Appl. No. 15/901,135; 16 pages.
Response to U.S. Final Office Action dated Apr. 12, 2021 for U.S. Appl. No. 15/901,135; Response filed May 25, 2021; 11 pages.
U.S. Notice of Allowance dated Aug. 17, 2021 for U.S. Appl. No. 15/901,135; 9 pages.

* cited by examiner

MAGNETIC-FIELD CLOSED-LOOP SENSORS WITH DIAGNOSTICS

CROSS-REFERENCE TO RELATED APPLICATION

This application is a continuation-in-part of U.S. patent application Ser. No. 17/140,429 filed Jan. 4, 2021 and entitled "Reducing Stray Field Magnetic Field Effects Using a Magnetic-Field Closed-Loop System," the entire content of which is incorporated herein by reference.

BACKGROUND

Magnetic field sensors utilize magnetic-field sensing elements to detect one or more magnetic fields. Magnetic-field sensors are often used to detect a ferromagnetic or conductive target and may generally act to detect motion or position of the target. Such sensors are found in many technology areas including robotics, automotive, manufacturing and so forth. For example, a magnetic field sensor may be used to detect when a vehicle wheel locks up (stops rotating), triggering the vehicle's control processor to engage an anti-lock braking system. Magnetic-field sensors may also detect distance to an object. As examples, magnetic-field sensors may be used to detect the position of a hydraulic piston or angular position of a steering column.

A magnetic-field sensing element may be a single element or, alternatively, may include two or more magnetic-field sensing elements arranged in various configurations, e.g., a half-bridge or full-bridge (Wheatstone) configuration. Depending on the device type and/or other application requirements, a magnetic-field sensing element may include, e.g., a type IV semiconductor material such as Silicon (Si) or Germanium (Ge), or a type III-V semiconductor material like Gallium-Arsenide (GaAs) or an Indium compound, e.g., Indium-Antimonide (InSb).

Hall effect elements are one class of magnetic field sensing elements that have a variable voltage in response to changes in an applied or sensed magnetic field. Magnetoresistance elements are another class of magnetic sensing elements that have a variable resistance that changes in response to changes in an applied or sensed magnetic field. There are different types of magnetoresistance elements, for example, semiconductor magnetoresistance elements such as ones including Indium Antimonide (InSb), anisotropic magnetoresistance (AMR) elements, giant magnetoresistance (GMR) elements, and tunneling magnetoresistance (TMR) elements, which are also referred to as magnetic tunnel junction (MTJ) elements. Some magnetoresistance elements, e.g., GMR and TMR elements, may have a limited linear output range in which a change in sensed magnetic-field intensity is linear with a corresponding change in the resistance of the elements.

SUMMARY

An aspect of the present disclosure is directed to and provides magnetic-field sensing using magnetic closed-loops with magnetic-field sensing elements, e.g., magnetoresistance (MR) elements, along with diagnostic circuitry operating in a separate frequency band than that used for magnetic field sensing. The magnetic field sensing elements (e.g., TMR elements and/or GMR elements) can be used in a first stage of a high gain amplifier which provides a feedback signal to a feedback coil in a closed loop to provide a magnetic feedback field. Magnetic stray field effects and any limited linearity of magnetic-field sensing elements can be masked by the loop gain of the closed loop. For a magnetic closed-loop, a negative feedback configuration can be used or a positive feedback configuration can be used with a loop-gain of less than one. The diagnostic signal traverses the closed-loop and provides information as to correct or incorrect functioning of the loop components.

One aspect of the present disclosure includes magnetoresistance circuitry configured to receive a residual magnetic field including a difference between an applied magnetic field produced by a magnetic field source at a first frequency and a feedback magnetic field (which may be at a second frequency) and produce an electrical output signal. The magnetoresistance circuitry can also include diagnostic signal generation circuitry configured to generate a diagnostic signal at a second frequency and combine the diagnostic signal with the output signal from the magnetoresistance circuitry to generate a combined signal that can include diagnostic signal and main signal components. The circuitry also includes feedback circuitry coupled to the magnetoresistance circuitry and configured to receive the combined signal, where the feedback circuitry is configured to produce a feedback signal based on the combined signal. The circuitry also includes feedback coil circuitry including a feedback coil configured to receive the combined signal and operative to generate the feedback magnetic field. The circuitry also includes diagnostic processing circuitry configured to extract the diagnostic signal from the combined signal and produce an error indication when the extracted diagnostic signal is outside of a normal-operation range. Other embodiments of this aspect include corresponding computer systems, apparatus, and computer programs recorded on one or more computer storage devices, each configured to perform the actions of the methods.

Implementations may include one or more of the following features. The feedback magnetic field used by the magnetic field sensor may include a scaled replica of the applied magnetic field. An amplitude of the residual magnetic field may be within a linearity range of the magnetoresistance circuitry. The feedback circuitry may include an amplifier operative to amplify the combined signal. The feedback circuitry may include a transconductance amplifier configured to drive the feedback coil. The magnetoresistance circuitry may include a plurality of magnetoresistance elements configured as a bridge. The bridge may include one or more tunneling magnetoresistance (TMR) elements. The bridge may include one or more giant magnetoresistance (GMR) elements. The magnetic field sensor may include main processing circuitry operative to extract a main signal from the combined signal and produce an output signal based on the main signal. The output signal can be indicative of a position of the magnetic source. The first frequency may be baseband frequency, e.g., between about DC and about 20 kHz; other frequencies may be used. The second frequency may be, e.g., between about 20 kHz and about 50 kHz; other frequencies may be used. The diagnostic processing circuitry can include a comparator configured to compare the extracted diagnostic signal to one or more values representing normal operation of the sensor. Implementations of the described techniques may include hardware, a method or process, or computer software on a computer-accessible medium. The feedback circuitry and feedback coil can be configured as a closed-loop configured to provide the feedback magnetic field to the magnetoresistance circuitry.

Another aspect of the present disclosure includes a magnetic field sensor having main coil circuitry configured to generate a magnetic field at a first frequency for reflection off of a target, and in response to the magnetic field, a reflected magnetic field can be generated from the target. The sensor can include magnetoresistance circuitry configured to receive a residual magnetic field including a difference between the reflected magnetic field and a feedback magnetic field and produce an electrical output signal. The sensor can include diagnostic signal generation circuitry configured to generate a diagnostic signal at a second frequency and combine the diagnostic signal with the output signal from the magnetoresistance circuitry to generate a combined signal that can include diagnostic signal and main signal components. The sensor also includes feedback circuitry coupled to the magnetoresistance circuitry and configured to receive the combined signal, where the feedback circuitry can be configured to produce a feedback signal, e.g., using an amplifier than provides a desired gain (A), based on the combined signal. The sensor can include feedback coil circuitry including a feedback coil configured to receive the combined signal and operative to generate the feedback magnetic field. The sensor can also include diagnostic processing circuitry configured to extract the diagnostic signal from the feedback signal and produce an error indication when the extracted diagnostic signal is outside of a normal-operation range. Other embodiments of this aspect include corresponding computer systems, apparatus, and computer programs recorded on one or more computer storage devices, each configured to perform the actions of the methods.

Implementations may include one or more of the following features. The feedback magnetic field used by the magnetic field sensor can include a scaled replica of the reflected magnetic field. An amplitude of the residual magnetic field may be within a linearity range of the magnetoresistance circuitry. Main coil circuitry can include a main coil and the feedback coil can be configured relative to the main coil to generate the residual magnetic field as the difference between the reflected magnetic field and the feedback magnetic field at the magnetoresistance circuitry. The feedback circuitry may include a first demodulator operative to receive the electrical output signal from the magnetoresistance circuitry and demodulate the electrical output signal by the first frequency to a baseband signal. The feedback circuitry may include an amplifier operative to amplify the combined signal. The diagnostic processing circuitry can include a second demodulator operative to demodulate the feedback signal with the second frequency. The feedback circuitry may include a transconductance amplifier configured to drive the feedback coil. The feedback circuitry further may include a modulator operative to modulate the feedback signal with a carrier at the first frequency.

The magnetoresistance circuitry may include a bridge including a plurality of magnetoresistance elements. The bridge may include one or more tunneling magnetoresistance (TMR) elements. The bridge may include one or more giant magnetoresistance (GMR) elements. The main coil circuitry may include a main coil having inner and outer loops, and the bridge can include two pairs of magnetoresistance elements, each pair disposed between the inner and outer loops at opposing positions relative to a central axis of the main coil. The feedback coil may include two feedback coils, each disposed around a respective pair of magnetoresistance elements. The magnetic field sensor may include main processing circuitry operative to extract a main signal from the combined signal and produce an output signal based on the main signal. The output signal may be indicative of a position of the magnetic source.

The first frequency may be, e.g., a modulation frequency between about 1 MHz and about 10 MHz; other frequencies may be used. The second frequency may be, e.g., between about 20 kHz and about 50 kHz; other frequencies may be used. The diagnostic processing circuitry may include a comparator configured to compare the extracted diagnostic signal to one or more values representing normal operation of the sensor. In some embodiments, the diagnostic signal generation circuitry can be configured to combine the diagnostic signal with the output signal from the magnetoresistance circuitry at the first frequency and prior to the first demodulator; in this case, $f_2$ would be added at $f_1+20$ kHz-50 kHz, such that after passing through the demodulator (at f1), the diagnostic (test) signal would end up in a desired band of, e.g., about 20 kHz to about 50 kHz, for processing in the magnetic field sensor. In some embodiments, the diagnostic signal generation circuitry can be configured to combine the diagnostic signal with the output signal from the magnetoresistance circuitry at the baseband and after the first demodulator. The feedback circuitry and feedback coil can be configured as a closed (feedback) loop configured to provide the feedback magnetic field to the magnetoresistance circuitry.

Implementations of the described techniques may include hardware, a method or process, or computer software on a computer-accessible medium. A system of one or more computers can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions.

BRIEF DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein.

DETAILED DESCRIPTION

Figure 1:
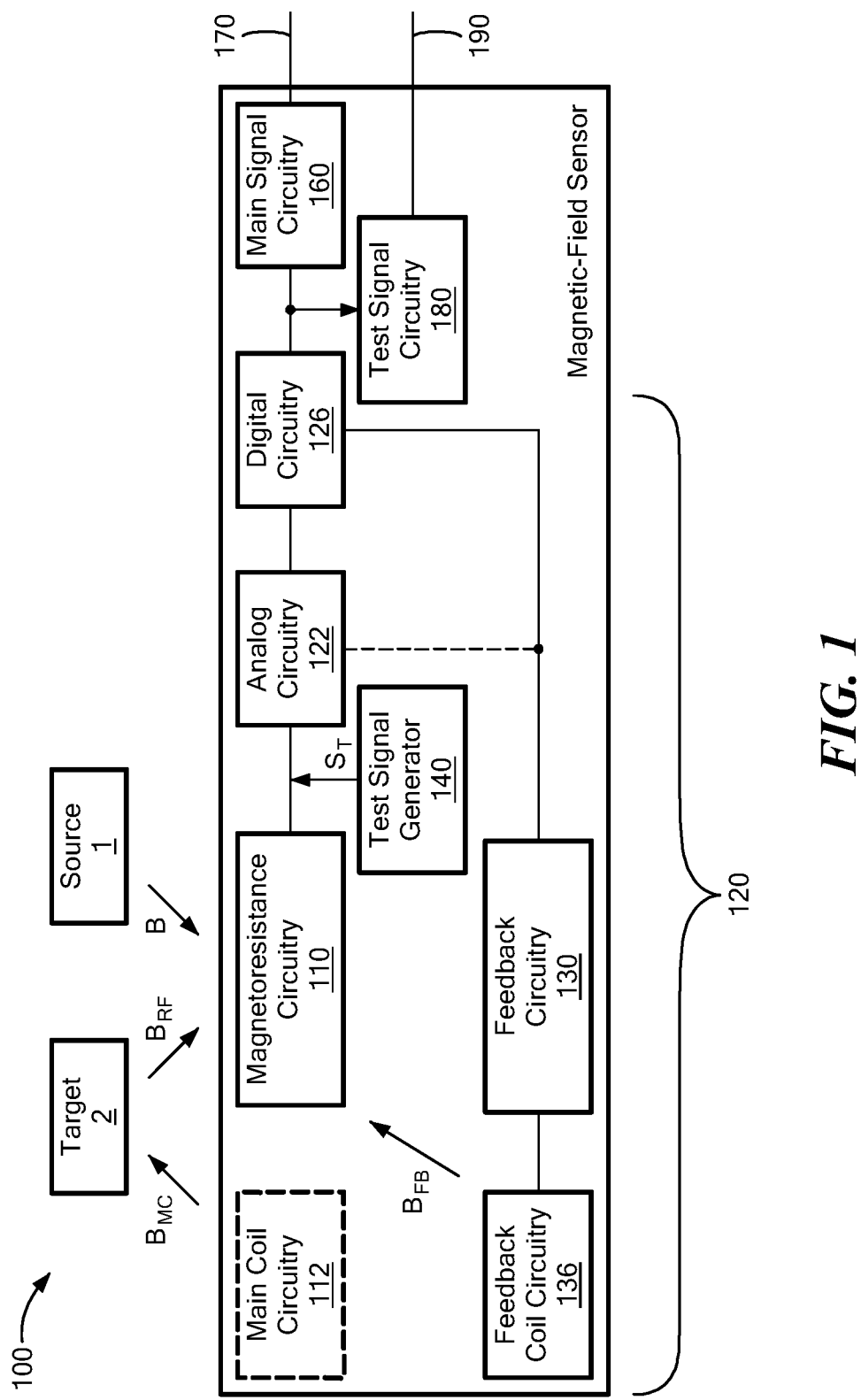
FIG. 1 is a block diagram of an example of a magnetic-field sensor having a magnetic closed-loop and out-of-band diagnostic circuitry, in accordance with the present disclosure.

An aspect of the present disclosure is directed to closed-loop magnetic field sensors that use magnetic-field sensing elements, e.g., magnetoresistance (MR) elements, while also employing diagnostic circuitry (diagnostics) operating in a separate frequency band than used for magnetic field sensing. The magnetic field sensors can include a magnetic closed-loop to achieve an overall sensitivity/gain that is independent of the sensitivity/gain of the magnetic-field sensing elements. Systems can use magnetic-field sensing elements, e.g., MR elements, in a first stage of a high gain amplifier in a feedback configuration. Deleterious effects of magnetic stray fields and any limited linearity of the magnetic-field sensing elements, e.g., MR element(s), can be masked by the loop gain of the closed loop. The sensed magnetic field, as is referred to herein as the applied magnetic field, can be from a magnetic field source or a reflected signal and can be amplified and fed back to the magnetic-field sensing elements, e.g., MR elements, by a feedback coil to compensate for the sensed magnetic field signal such that the magnetic-field sensing elements operate in a linear range. The feedback configuration can be a negative feedback configuration, in exemplary embodiments. In other embodiments, a positive feedback configuration may be used, e.g., with a controlled gain of less than unity (1.0). A diagnostic signal that is out-of-band of the sensed magnetic field signal can be injected into the closed loop to determine whether the loop components are operating within normal operating parameters and/or to determine when operational faults have occurred or are likely to occur.

Embodiments of the present disclosure include a magnetic feedback loop that can linearize a response of magnetic-field sensing elements, e.g., magnetoresistance elements (mgs) such as TMRs and/or GMRs or the like. The linearization can be accomplished using a single bridge (instead of multiple) for the magnetic field sensing elements. By achieving large enough loop gain, the overall system/sensor sensitivity/gain does not depend on the sensitivity of the given magnetic-field sensing elements and can therefore avoid negative impacts arising from any associated non-linearities of the magnetic-field sensing elements. By not depending on the sensitivity/gain of the magnetic-field sensing elements, e.g., xMRs, undesirable nonlinear effects can be masked. Examples of undesirable nonlinear effects can include sensitivity drifts produced by stray magnetic fields shifting the operating point of a TMR on its transfer function curve to a non-linear region.

As used herein, the term "magnetic-field sensor" is used to describe a circuit that uses one or more magnetic field sensing elements, generally in combination with other circuits. Magnetic-field sensors are used in a variety of applications, including, but not limited to, angle sensors that sense an angle of a direction of a magnetic field, current sensors that sense a magnetic field generated by a current carried by a current-carrying conductor, magnetic switches that sense the proximity of a ferromagnetic object, rotation detectors that sense passing ferromagnetic articles, for example, magnetic domains of a ring magnet or a ferromagnetic target (e.g., gear teeth) where the magnetic-field sensor is used in combination with a back-biased or other magnet, and magnetic-field sensors that sense a magnetic-field density of a magnetic field.

As used herein, the term "target" is used to describe an object or portion of an object to be sensed or detected by a magnetic-field sensor or a magnetic-field sensing element such as a magnetoresistance element. The target may include a conductive material that allows for eddy currents to flow within the target, for example a metallic target that conducts electricity.

FIG. 1 is a block diagram of an example of a magnetic-field sensor 100 having a magnetic closed-loop and out-of-band diagnostic circuitry, in accordance with the present disclosure. Magnetic-field sensor 100 includes magnetoresistance circuitry 110 that is part of a magnetic closed loop (a.k.a., feedback loop) 120 including feedback circuitry 130 and a feedback coil 136 that generates a feedback magnetic field ($B_{FB}$). The magnetoresistance circuitry 110 is configured to sense or detect one or more magnetic fields, including a residual magnetic field (a.k.a., a resultant or error magnetic field) resulting from a combination of an external applied (B) or reflected ($B_{RF}$) magnetic field, which may be at a first frequency ($f_1$), and the feedback magnetic field ($B_{FB}$). Sensor 100 can also include analog circuitry 122, e.g., one or more amplifiers (not shown) and digital circuitry 126, e.g., one or more filters (not shown), which can be used to process and/or condition the output signals of the magnetoresistance circuitry and/or the test signal ($S_T$) as a feedback signal. The closed loop 120 is configured to use the feedback signal to generate the feedback magnetic field ($B_{FB}$) and supply the feedback magnetic field ($B_{FB}$) to the magnetoresistance circuitry 110. The magnetic field sensor 100 includes diagnostic signal generation circuitry, indicated by test signal generator 140, that is operative to generate a diagnostic or test signal ($S_T$) which is used by the sensor 100 to determine whether the components of the closed loop 120 are operating correctly. The diagnostic signal ($S_T$) may be at a second frequency ($f_2$) different than, or "out-of-band" compared to $f_1$.

Main signal circuitry 160 can be included to process a main signal from the output of the magnetoresistance circuitry 110, e.g., for measuring a position of a source 1 or target 2 in order to generate a sensor output signal 170 that can be indicative of the position. Diagnostic circuitry can also be included to process the diagnostic or test signal ($S_T$), as indicated by test signal circuitry 180, e.g., for determining whether components in loop 120 are operating within desired operational ranges in order to generate a diagnostic signal (or related output) 190.

The diagnostic signal generation circuitry 140 operates to supply (inject) the test signal or diagnostic signal ($S_T$) to the closed loop 120. For example, the test signal generator 140 can inject the test signal into the closed loop 120 after the output of the magnetoresistance circuitry 110 using, e.g., using a summing unit (not shown). The diagnostic signal can be processed by all components along the path of the closed loop 120 and can be used to determine either correct operation or faulty operation of the components.

The applied magnetic field can be a magnetic field (B) produced by or from a magnetic-field source 1 and/or a reflected magnetic field ($B_{RF}$) reflected from a target 2, e.g., a conductive target. In example embodiments, a target 2 may include, but is not limited to, a portion of a moving metal machine component such as a gear tooth, a camshaft lobe, or a magnetic domain on a rotating shaft, or a magnetic domain on a rotating/moving element, etc. For embodiments sensing a reflected magnetic field ($B_{RF}$) reflected from a target 2, the sensed magnetic field can result from a main coil magnetic field ($B_{MC}$) that is generated by a main coil as part of main coil circuitry 112 and that is then directed to and reflected from the target 2 as the reflected magnetic field ($B_{RF}$), with the reflected magnetic field allowing measurement of a position of the target 2.

Figure 2:
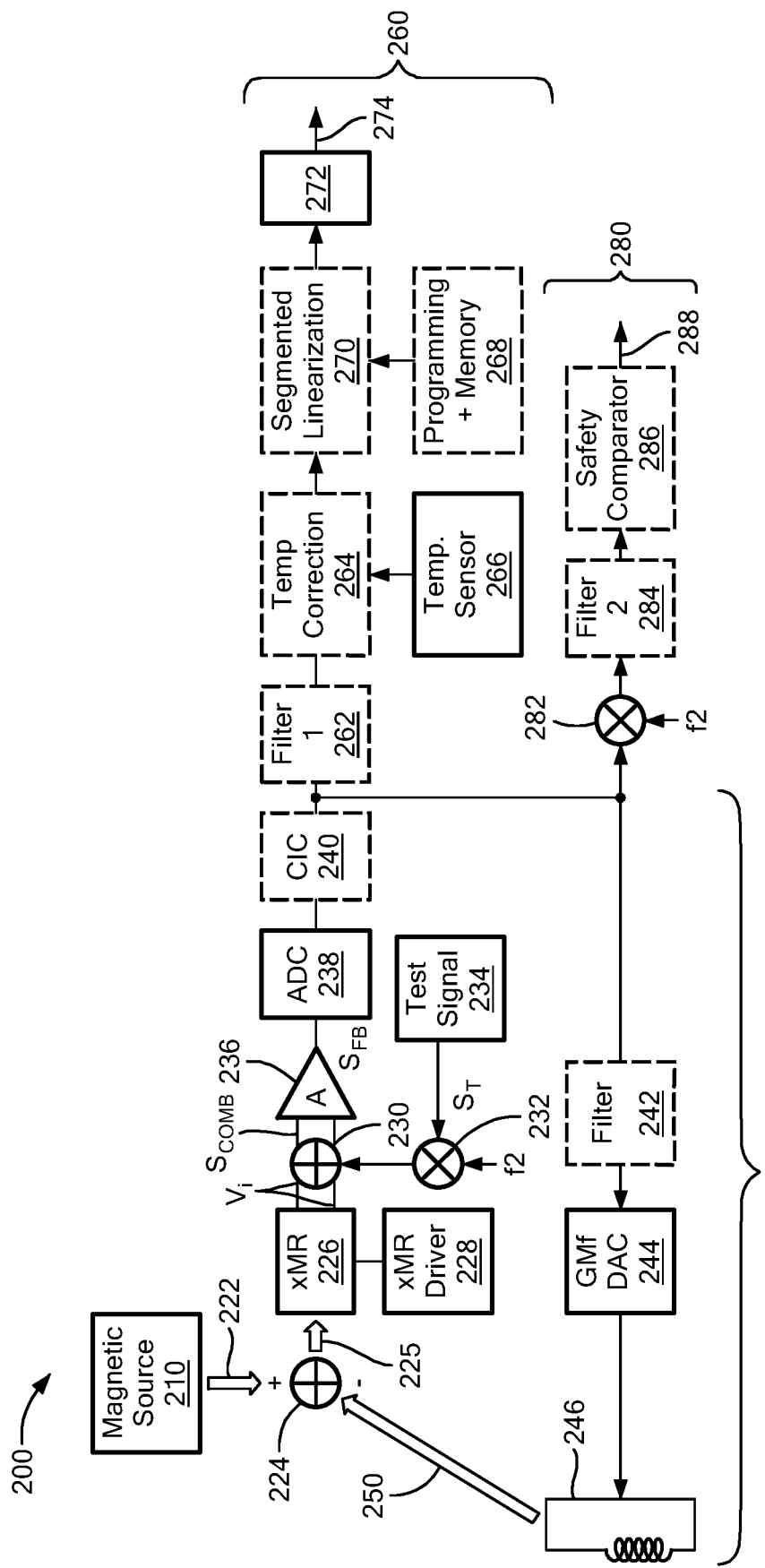
FIG. 2 is a block diagram of an example of a closed-loop magnetic-field sensor including out-of-band diagnostic circuitry for detecting an applied magnetic field, in accordance with the present disclosure.

FIG. 2 is a block diagram of an example of a closed-loop magnetic-field sensor 200 including out-of-band diagnostic circuitry for detecting an applied magnetic field (B) 222, in accordance with the present disclosure. The magnetic-field sensor 200 includes a magnetic closed loop 220 including magnetoresistance circuitry 226, feedback circuitry 244, and feedback coil circuitry 246 configured to generate a feedback magnetic field 250. The magnetoresistance circuitry 226 is configured to receive or detect a residual magnetic field 225—resulting from a combination of applied magnetic field 222 and feedback magnetic field 250—and produce a corresponding electrical output signal, e.g., as a differential output voltage signal ($V_i$). Magnetoresistance circuitry 226 can be driven by a magnetoresistance element driver 228. In example embodiments, the magnetoresistance circuitry 226 can include multiple magnetoresistance elements, e.g., four elements, in a bridge configuration. Closed loop 220 also includes diagnostic signal generation circuitry, indicated by test signal generator 234, that functions to generate a diagnostic or test signal ($S_T$) that can be used for diagnostic purposes. In example embodiments, the diagnostic signal ($S_T$) is at a frequency band separate from (out-of-band relative to) the frequency band of the applied magnetic field 222. In example embodiments, the applied magnetic field 222 can include a baseband signal having a frequency range (first frequency range) from, e.g., direct current (DC) to about 20 kHz. The electrical output signal of the magnetoresistance circuitry 226 can include main signal and diagnostic signal components. The magnetic-field sensor 200 can also include additional processing paths with analog and/or digital components for processing main and diagnostic signal components of the electrical output signal, e.g., indicated by main signal path 260 and diagnostic signal path 280, as described in further detail below.

In example embodiments, the feedback magnetic field 250 can be combined with the applied magnetic field 222 in a negative feedback configuration (as indicated by negative sign at 224) to form a residual magnetic-field 225 that is near zero, e.g., in the linear operational range of the magnetoresistance circuitry 226. For example, by having opposite polarities, the external magnetic field 222 and the feedback magnetic field 250 may sum to near zero. In alternate embodiments, the feedback magnetic field 250 can be combined with the applied magnetic field 222 in a positive feedback configuration with a gain of less than zero, e.g., such that the residual magnetic field 225 is near zero. As magnetoresistance circuitry 226 is operative to detect the residual magnetic field 225, which is a combination of the applied magnetic field 222 and the feedback magnetic field 250, the magnetoresistance circuitry 226 can detect signals contained or propagating in the residual magnetic field 225, the applied magnetic field 222, and/or the feedback magnetic field 250.

External magnetic field 222 and feedback magnetic field 250 are indicated as being combined by sum unit 224, however an electronic sum unit 224 is not necessary for combination of the magnetic fields 222, 250 as they may be combined (e.g., be superposed) in any medium or in free space. For example, placement and/or geometry of sensing elements of magnetoresistance circuitry 226 with respect to the magnetic source 210 and feedback coil 246 can result in generation of the residual magnetic field 225 as the difference between the applied magnetic field 222 and the feedback magnetic field 250. As shown, when the fields are combined, feedback magnetic field 250 can be subtracted from applied magnetic field 222 to result in residual magnetic field 225. The feedback magnetic field 250 generated by the feedback coil circuitry 246 can accordingly be used, in example embodiments, to reduce or attenuate the residual magnetic field such that the magnetoresistance circuitry 226 is operational in a linear region of the transfer function curve of the included magnetoresistance elements. In example embodiments, the feedback magnetic field 250 can include a scaled replica of the applied magnetic field 222, e.g., with an opposite polarity or with a phase of plus or minus $\pi$. Use of the feedback magnetic field 250 can accordingly allow the magnetoresistance circuitry 226 to be used in a linear range of operation and mitigate negative effects arising from undesirable signal components, for example, one or more stray magnetic fields, that may be included in the applied magnetic field 222. The loop 220 can include one or more amplifiers 236 to provide a desired loop gain, without relying on the sensitivity or gain of the magnetoresistance circuitry 226, as described in further detail below.

The closed loop 220 also includes a diagnostic signal generator, as indicated by test signal generator block 234, to generate test or diagnostic signal ($S_T$). The diagnostic signal ($S_T$) can traverse all components along the path of the closed loop 220 and be processed, e.g., by diagnostic path 280, to determine correct or faulty operation of the loop components. The test or diagnostic signal ($S_T$) can include any suitable or desired waveform, e.g., individual pulses or a sequence of pulses. The diagnostic signal ($S_T$) can be placed at or shifted to a frequency band (second frequency band), indicated by ($f_2$) at modulator 232, that is separate from (out-of-band compared to) the applied magnetic field so that the diagnostic signal can traverse the closed loop 220 and provide diagnostics capability for the loop components without interfering with the feedback and main signals in the main signal band (e.g., corresponding to the applied magnetic field baseband). The modulated diagnostic signal at $f_2$ can be added or injected to the output of the magnetoresistance circuitry 226, e.g., by summing unit 230, producing a combined signal ($S_{COMB}$) that includes the diagnostic signal and the electrical output signal from the magnetoresistance circuitry 226. The combined signal can then be provided to amplifier 236 for generating the (unfiltered) feedback signal.

The closed loop 220 can also include a loop amplifier 236 configured to receive the combined signal from the summing unit 230, a desired level of gain (A), and produce an output signal for use as a feedback signal ($S_{FB}$) in the loop. Loop 220 can also include an analog-to-digital converter 238 to convert the feedback signal from an analog signal to a digital signal. One or more filters, e.g., cascaded integrator-comb (CIC) filter 240 and/or digital filter 242, may be included for filtering the feedback signal, e.g., as low-pass filters to remove high-frequency components.

The feedback signal ($S_{FB}$) can be provided to the feedback circuitry 244 to drive feedback coil 246 and generate the feedback magnetic field 250. The feedback signal can also be provided to a main signal path 260 for extracting a main signal component and producing an output signal 274 of the magnetic field sensor 200, as described in further detail below. In some examples, the output signal 274 may indicate an angle and/or position associated with the magnetic source 210. As described in further detail below, the diagnostic signal ($S_T$) can be extracted from the feedback signal and provided to a diagnostic signal path 280 for processing, e.g., to determine whether components in the closed-loop 220 are operating properly and/or within desired ranges.

The feedback circuitry 244 can further process the feedback signal ($S_{FB}$) to provide to the feedback coil 246 for generating the feedback field 250. For example, the feedback signal can be converted from a voltage to a current; the feedback signal may also be converted from a digital signal to an analog signal. Any suitable voltage-to-current converter and/or DAC may be used. In example embodiments, a digital voltage signal can be converted to an analog current signal, as indicated by transconductance amplifier (GMf) and digital-to-analog converter (DAC) block 244. The feedback coil circuitry 246 can generate the feedback magnetic field 250 based on the feedback signal.

Main signal path 260 can receive the feedback signal and process main signal components, e.g., after filtering out the diagnostic signal component, and provide a main signal output 274 for the sensor 200. The feedback signal may be provided to low pass filter 262 which can be used to filter out the diagnostic signal, which is at $f_2$, and pass the main signal baseband portion. Filter 262 may also filter noise and/or other artifacts, e.g., from output of the CIC filter 240. Main signal path 260 may include a temperature correction circuit 264, a temperature sensor 266, a programming and memory circuit 268, a segmentation and linearization block 270, and an output interface 272, providing main signal output 274. Temperature correction block 264 may scale the output voltage signal $V_o$ according to temperature, e.g., a temperature measured by the temperature sensor 266. Main signal path 260 can provide main signal output 274, which in example embodiments may be indicative of an angle or position associated with magnetic source 210.

Diagnostic signal path 280 can receive the feedback signal and process the diagnostic signal ($S_T$) to determine whether components of the closed-loop 220 are working properly and, if not, produce a warning indication, e.g., a flag or error message. Demodulator 282 can demodulate the feedback signal, shifting the diagnostic signal (by $f_2$) back to a baseband signal and at the same time filtering out the main signal component since that signal component was at baseband when initially received by the diagnostic signal path 280. Filter 284 can filter out undesirable signal components, e.g., high-frequency components due to noise or ripple effects due to modulation or demodulation. The diagnostic signal can be compared, e.g., by safety comparator 286, to one or more ranges or thresholds that indicate normal functioning.

Diagnostic signal path 280 can produce an output signal 288 indicating whether the diagnostic signal ($S_T$) indicates normal functioning of the components of the closed loop 220. If the comparison indicates that the diagnostic signal ($S_T$) is outside of a range of normal operation or does not meet one or more minimum thresholds for operation then a warning indication can be produced, e.g., included in output signal 288. In example embodiments, safety comparator 286 can include pre-programmed threshold values. The safety comparator 286 can use one or more thresholds, e.g., according to particular tolerances that might be required or used for safety in order to define a warning condition (e.g., a "safety violation condition") according to particular tolerances defined for safety, e.g., according to an Application Safety Integration Level (ASIL) in accordance with a safety standard such as ISO 26262.

The magnetic field sensor 200 may be analyzed in terms of (i) the residual (error) signal at the output of the magnetoresistance circuitry 226, $V_i$; (ii) the diagnostic (test) signal (VT); (iii) the feedback signal ($V_o$) at the output of the loop amplifier; and (iv) the magnetic field signal B (applied field 222), as follows:

$$V_i = B \cdot S_{TMR} + VT - V_o \cdot d \cdot K_{SC} \cdot S_{TMR}, \quad (EQ.\ 1)$$

where $B \cdot S_{TMR}$ is the applied magnetic field signal 222 from source 210 as scaled by the sensitivity of the magnetoresistance circuitry 226 using nominal TMR elements; and $V_o \cdot d \cdot K_{SC} \cdot S_{TMR}$ is the feedback magnetic field signal 250 from feedback coil 246 as scaled by the sensitivity of the magnetoresistance circuitry 226;

$$V_0 = V_i \cdot A = (B \cdot S_{TMR} + VT - V_o \cdot d \cdot K_{FC} \cdot S_{TMR}) \cdot A, \quad (EQ.\ 2)$$

$$V_0 = \frac{(B \cdot S_{TMR} + VT) \cdot A}{1 + GMf \cdot K_{FC} \cdot S_{TMR} \cdot A}, \quad (EQ.\ 3)$$

$$= \frac{B}{GMf \cdot K_{FC}} + \frac{VT}{GMf \cdot K_{FC} \cdot S_{TMR}}, \text{ when } A \gg 1 \quad (EQ.\ 4)$$

$$I_{FC} = V_o \cdot d,$$

and where:
$S_{TMR}$=TMR sensitivity,
d=voltage-to-current feedback gain,
$A \cdot S_{TMR}$=loop gain,
B=magnetic field from magnetic source,
$K_{FC}$=feedback coil field coupling factor,
VT=Test signal voltage As indicated, for a high enough loop gain (A>>1), the system gain is independent of the magnetoresistance circuitry sensitivity $S_{TMR}$.

Thus, as described above, non-linear behavior of one or more magnetoresistance elements, e.g., TMR elements in a bridge, can be masked by the magnetic-field closed-loop architecture of sensor 200 and the overall system gain does not depend solely on the sensitivity of any given magnetoresistance elements used for the system, e.g., a TMR. The feedback coil 246 compensates for magnetic fields from the source 210, keeping the magnetic-field sensing element(s), e.g., TMR element(s), in a linear operational range, e.g., at an operating point at or near zero Gauss.

Figure 3:
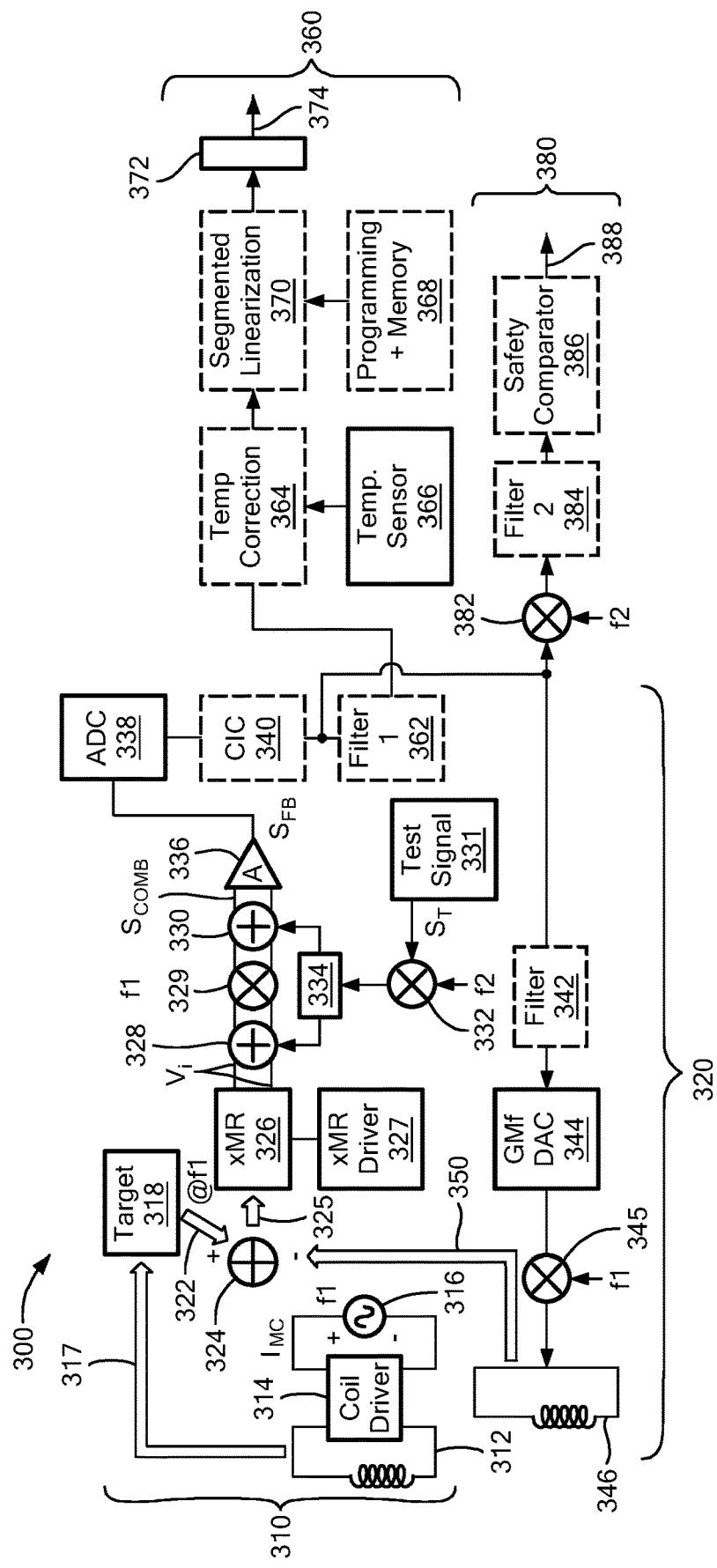
FIG. 3 is a block diagram of an example of a closed-loop magnetic-field sensor with out-of-band diagnostic circuitry configured for detecting a reflected magnetic field, in accordance with the present disclosure.

FIG. 3 is a block diagram of an example of a closed-loop magnetic-field sensor 300 with out-of-band diagnostic circuitry configured for detecting an applied magnetic field in the form of a reflected magnetic field, in accordance with the present disclosure. The magnetic-field sensor 300 includes a magnetic closed or feedback loop 320 including magnetoresistance circuitry 326, feedback circuitry 344, and feedback coil circuitry 346 configured to produce a feedback magnetic field 350. The magnetoresistance circuitry 326 is configured to receive or detect a residual magnetic field 325 including a difference between the reflected magnetic field 322 and the feedback magnetic field 350 and produce an electrical output signal, e.g., as a differential output voltage signal, $V_i$. Main coil circuitry 310 can be used to generate a main coil magnetic field 317, which can be directed to and reflected from a potentially movable 318 target to produce the reflected magnetic field 322. From the interaction with the target 318, the reflected magnetic field 322 can include information about the target, e.g., a main signal component related to position of the target 318, which the sensor 300 can process. Loop 320 also includes a diagnostic or test signal generator 331 that functions to generate a diagnostic or test signal ($S_T$) that can be used for diagnostic purposes. The magnetic-field sensor 300 can also include additional processing paths with analog and/or digital components for processing main and diagnostic signals, e.g., indicated by main signal path 360 and diagnostic signal path 380, as described in further detail below.

In example embodiments, the magnetoresistance circuitry 326 can include multiple magnetoresistance elements, e.g., four elements, in a bridge configuration. In example embodiments, the magnetoresistance elements may be, e.g., GMR elements and/or TMR elements. Magnetoresistance circuitry 326 can be driven by a magnetoresistance element driver 327. The loop 320 can include one or more amplifiers, as indicated by amplifier 336 with desired/selected gain (A). The amplifier(s) 336 can receive the electrical output signal from the magnetoresistance circuitry 326, provide a desired gain, and produce a feedback signal ($S_{FB}$) as an output for further use/processing in loop 320. The feedback signal can include main signal and diagnostic signal components. The one or more amplifier(s) 336 can provide a desired gain (loop gain) for the loop 320 without relying on the sensitivity or gain of the magnetoresistance circuitry 326. The amplified baseband feedback signal ($S_{FB}$) can be converted from an analog signal to a digital signal by an analog-to-digital converter (ADC) 338. In example embodiments, ADC 338 may be a sigma-delta ADC.

Main coil circuitry 310 includes a main coil 312 that generates the main coil magnetic field ($B_{MC}$) 317. A main coil driver 314 is operative to drive the main coil 312 using a source 316 (e.g., a current source or a voltage source) configured to generate a main coil drive signal at a desired first frequency ($f_1$). The main coil 312 is configured to direct the main coil magnetic field ($B_{MC}$) 317 to the target 318. In example embodiments, additional radiative conductive (e.g., antenna) elements (not shown) can facilitate direction of the main coil magnetic field ($B_{MC}$) 317. In example embodiments, the first frequency ($f_1$) can be selected to facilitate reflection from a conductive target 318. Higher frequencies, e.g., over 1 MHz or in the range of 1 MHz to 10 MHz (inclusive of the end points), can produce more pronounced reflection than lower frequencies. The main coil magnetic field ($B_{MC}$) 317 can be reflected from the target 318 as a reflected magnetic field ($B_{RF}$) 322 at an RF frequency band, and then combined with a feedback magnetic field 350 generated by the feedback coil circuitry 346. In example embodiments, the main coil 312 can have a coupling factor $K_{MC}$ of 60 Gauss per amp; main coils with other coupling factor values may of course be used within the scope of the present disclosure. The reflected magnetic field 322 accordingly can include information about the target 318, which can be extracted from the reflected magnetic field 322 and/or the residual magnetic field 325 and used by the sensor 300, e.g., after demodulation to remove the ($f_1$) carrier component initially provided by the main coil magnetic field 317.

As shown, when the fields are combined, feedback magnetic field 350 can be subtracted from applied magnetic field 322 to result in residual magnetic field 325. In example embodiments, the feedback magnetic field 350 can include a scaled replica of the reflected magnetic field 322, e.g., with an opposite polarity or with a phase of plus or minus $\pi$ (180 degrees). The feedback magnetic field 350 generated by the feedback coil circuitry 346 can be used, in example embodiments, to reduce or attenuate the residual magnetic field 325 such that the magnetoresistance circuitry 326 is operational in a linear region of its transfer function curve. Use of the feedback magnetic field 350 can accordingly allow the magnetoresistance circuitry 326 to be used in a linear range of operation and mitigate negative effects arising from undesirable signal components, for example, one or more stray magnetic fields, that may be included in the external magnetic field. While reflected magnetic field 322 and feedback magnetic field 350 are indicated as being combined by sum unit 324, an electronic sum unit 324 is not necessary for combination of the magnetic fields 322, 350 as they may be combined (e.g., be superposed) in any medium (e.g., one or more conductors or coils, etc.) or even air or free space. For example, placement and/or geometry of sensing elements 326 with respect to the main coil 312, target 318, and feedback coil 346 can result in generation of the residual field 325 as the difference between the applied magnetic field in the form of reflected field 322 and the feedback magnetic field 350. An example configuration is shown and described in connection with FIG. 6.

Main coil circuitry 310 can be configured to generate the main (first) magnetic field 317 at a first frequency ($f_1$). The first frequency can be selected to facilitate reflection, e.g., by way of eddy-current generation, from conductive target 318. In example embodiments, the first frequency may be selected in a range from about 1 MHz to about 10 MHz; the first frequency may be at other frequencies and/or ranges in other embodiments. As noted, the first magnetic field 317 can be reflected off target 318 to form the reflected signal 322. In example embodiments, the target can have a position that varies over time (with respect to the magnetoresistance circuitry 326) and the reflected magnetic field 322 at the magnetoresistance circuitry 326 can be a function of the position of the target 318. The closer the target 318 is to the magnetoresistance circuitry 326 of the magnetic-field sensor 300, the larger the magnitude (amplitude) of the reflected signal will be at the magnetoresistance circuitry 326; conversely, the further the target 318 is from the magnetoresistance circuitry 326, the smaller the magnitude (amplitude) of the reflected signal will be at the magnetoresistance circuitry 326. In example embodiments, the target 318 can include a ferromagnetic and/or conductive material, e.g., aluminum, an aluminum alloy, steel, metal-coated plastic, etc. In example embodiments, the target 318 may be a rotating target. In some example embodiments, a rotating target 318 may include gear teeth or a shaft with one or more magnetic domains in a mechanical assembly, e.g., a transmission or engine component.

In example embodiments, the reflected magnetic field ($B_{RF}$) can be modulated at a relatively high frequency (e.g., 1-10+ MHz) to produce or facilitate reflection from the target 318. The residual magnetic-field signal, e.g., at the output of the magnetoresistance circuitry 326, can accordingly be demodulated from the first frequency ($f_1$) in the forward signal path down to baseband for further conditioning and/or processing, as indicated by demodulator (mixer) 329. As described in further detail below, the magnetic-field feedback loop 320 remodulates the conditioned feedback signal ($S_{FB}$) back to the first frequency ($f_1$), as indicated by modulator (mixer) 345, for use by the feedback coil 346 in generating the feedback magnetic field 350.

In example embodiments, the feedback magnetic field 350 can be combined with the reflected magnetic field 322 (from target 318) in a negative feedback configuration (as indicated by negative sign at 324) to form the residual magnetic-field 325. As noted above, the residual magnetic field may have a magnitude (amplitude) that is near zero, e.g., in the linear operational range of the magnetoresistance circuitry 326. For example, by having opposite polarities, the reflected magnetic field 322 and the feedback magnetic field 350 may sum to near zero. In alternate embodiments, the feedback magnetic field 350 can be combined with the reflected magnetic field 322 in a positive feedback configuration with a controlled gain of less than zero, e.g., such that the residual magnetic field 325 is near zero.

As described above, the closed loop 320 also includes a diagnostic signal generator, as indicated by test signal generator block 331, to generate the test or diagnostic signal ($S_T$). The diagnostic signal ($S_T$) can traverse all components along the path of the closed loop 320 and be processed, e.g., by diagnostic path 380, to determine correction or faulty operation of the loop components. The test or diagnostic signal ($S_T$) can include any suitable or desired waveform. The diagnostic signal ($S_T$) can be placed at or shifted to a frequency band, e.g., a second frequency as indicated by ($f_2$) at modulator 332, that is separate or distinct from the first frequency ($f_1$) of the reflected magnetic field ($B_{RF}$) so that the diagnostic signal ($S_T$) can traverse the closed loop 320 and provide diagnostics capability for the loop components without interfering with the feedback and main signals at the main signal band (e.g., corresponding to the reflected magnetic field baseband). The modulated diagnostic signal at $f_2$ can be added or injected to the output of the magnetoresistance circuitry 326 to produce a combined signal ($S_{COMB}$) that includes the diagnostic signal and the electrical output signal from the magnetoresistance circuitry 326 including main signal component(s). The modulated diagnostic signal at $f_2$ can be added or injected to the output of the magnetoresistance circuitry 326, e.g., by summing unit 328 prior to demodulator 329 or by summing unit 330 after demodulator 329. In example embodiments, a switch 334 may be used to select between summing units 328 and 330 and thereby select between injection points for the test signal ($S_T$) on the forward signal path. The combined signal ($S_{COMB}$) can then be provided to amplifier 336. For embodiments adding (injecting) the diagnostic signal into the signal path before demodulator 329, f2 can be selected such that the previously-noted range of f2 (e.g., 20 kHz-50 kHz) is obtained after demodulation from f1. For example, using summing unit 328 and a nominal f1 of 1 MHz, f2 could be selected as being in the range of 1.02 MHz to 1.05 MHz. For this example, after demodulation by demodulator 329 (at f1=1 MHz), this would result in the diagnostic signal ($S_T$) being in a band separated from the main signal band by 20 kHz-50 kHz (similar to $f_2$ in closed loop 220 in FIG. 2).

The closed loop 320 can also include a loop amplifier 336 configured to receive the combined signal ($S_{COMB}$) from the summing unit 330 and amplify the combined signal to form the feedback signal, providing a desired level of gain (A). Loop 320 can also include an analog-to-digital converter 338 to convert the feedback signal from an analog signal to a digital signal. One or more filters, e.g., cascaded integrator-comb (CIC) filter 340 and/or digital filter 342, may be included for filtering the feedback signal.

The feedback signal ($S_{FB}$) can be used, e.g., after filtering, by the feedback circuitry 344 to drive feedback coil 346 and generate the feedback magnetic field 350. The feedback signal ($S_{FB}$) can also be provided to the main signal path 360 for producing an output signal 374 of the magnetic field sensor 300. In some examples, the output signal 374 may indicate the angle and/or position associated with the magnetic source 310. The diagnostic signal ($S_T$) can be extracted from the combined signal and provided to a diagnostic signal path 380 for processing, e.g., to determine whether components in the closed-loop 320 are operating within desired ranges.

The feedback circuitry 344 can further process the feedback signal ($S_{FB}$) to provide to the feedback coil 346 for generating the feedback field 350. For example, the feedback signal ($S_{FB}$) can be converted from a voltage to a current; the feedback signal may also be converted from a digital signal to an analog signal. Any suitable voltage-to-current converter and/or DAC may be used. In example embodiments, a digital voltage signal can be converted to an analog current signal, as indicated by transconductance amplifier (GMf) and digital-to-analog converter (DAC) block 344. The analog current signal from the block 344 can be provided to a modulator or mixer 345. The mixer 345 can mix (modulate) the analog current signal with the first frequency ($f_1$) to form an AC current signal $I_{SC}$ to drive (power) the feedback coil 346 for generating the feedback magnetic field 350. In alternate embodiments, the feedback signal may be a voltage signal used to drive the feedback coil 346. In example embodiments, the feedback coil 346 can have a desired/selected coupling factor $K_{SC}$ of, e.g., 800 Gauss per amp; feedback coils with other coupling factors may of course be used within the scope of the present disclosure.

Main signal path 360 can process the main signal (e.g., the combined signal having the diagnostic signal portion filtered out) and provide a main signal output 374 for the sensor 300. The feedback signal ($S_{FB}$), with combined main signal and diagnostic signal components, may be provided to main signal path 360 for processing of the main signal component(s). The feedback signal may be provided to low pass filter 362 which can filter out the diagnostic signal (at $f_2$) and pass the baseband portion including the main signal component. Filter 362 may also filter noise and other artifacts, e.g., from output of the CIC filter 340. Main signal path 360 may include a temperature correction circuit 364, a temperature sensor 366, a programming and memory circuit 368, a segmentation and linearization block 370, and an output interface 372, providing main signal output 374. Temperature correction block 364 may scale the output voltage signal $V_o$ according to temperature, e.g., a temperature measured by the temperature sensor 366. Main signal path 360 provides main signal output 374, which in example embodiments may be used for determining an angle or position associated with target 318.

Diagnostic signal path 380 can process the diagnostic signal ($S_T$) to determine whether components of the closed-loop 320 are working properly and, if not, produce a warning indication, e.g., a flag or error message. Demodulator 382 can receive and demodulate the feedback signal ($S_{FB}$), with combined main signal and diagnostic signal components, shifting the diagnostic signal (by $f_2$) back to a baseband signal and at the same time shifting the main signal to upper frequencies to facilitating filtering by filter 384, since that signal was at baseband when initially received by the diagnostic signal path 380. Filter 384 can filter out the main signal component and may further filter out other undesirable signal components, e.g., high-frequency components due to noise or ripple effects dues to modulation or demodulation. The diagnostic signal ($S_T$) can be compared, e.g., by safety comparator 386, to one or more ranges or thresholds that indicate normal functioning. Based on a result of the comparison by the safety comparator 386, diagnostic signal path 380 can produce an output 388 indicative of the operation of the closed loop 320. The output 388 can be produced at desired times, e.g., every second (1 s), or other basis, e.g., when the comparison indicates that the diagnostic signal does not meet or match a threshold or range of normal operation or that the comparison indicates abnormal or undesirable operation of loop components has occurred or will occur. Safety comparator 386 can include pre-programmed threshold values. In example embodiments, one or more thresholds can be set in order to define a "safety violation condition" according to particular tolerances defined for safety, e.g., according to an Application Safety Integration Level (ASIL) in accordance with a safety standard such as ISO 26262.

Sensor 300 can be analyzed similarly as above for sensor 200, adjusting for the reflected magnetic field by using a reflected magnetic field term, $B_{RF}(x)$, substituted for the source magnetic field term, B, in EQS. 1-4 as follows:

$$V_i = B_{RF}(x) \cdot S_{TMR} + VT - V_o \cdot d \cdot K_{FC} \cdot S_{TMR}, \quad (EQ. 5)$$

where $B_{RF}(x) \cdot S_{TMR}$ is the reflected magnetic field signal 322 and $V_o \cdot d \cdot K_{FC} \cdot S_{TMR}$ is the feedback magnetic field signal 350, and:

$$V_0 = V_i \cdot A = (B_{RF}(x) \cdot S_{TMR} + VT - V_o \cdot d \cdot K_{FC} \cdot S_{TMR}) \cdot A, \quad (EQ. 6)$$

$$V_0 = \frac{(B_{RF}(x) \cdot S_{TMR} + VT) \cdot A}{1 + GMf \cdot K_{FC} \cdot S_{TMR} \cdot A}, \quad (EQ. 7)$$

$$= \frac{I_{MC} \cdot K_R(x)}{GMf \cdot K_{FC}} + \frac{VT}{GMf \cdot K_{FC} \cdot S_{TMR}}, \text{ when } A \gg 1, \quad (EQ. 8)$$

$$B_{RF(x)} = I_{MC} \cdot K_R(x), \quad (EQ. 9)$$

$$K_R(x) = \frac{K_{MC} \cdot K_{cond}\left[\frac{G}{A} \cdot mm^2\right]}{x^2}, \quad (EQ. 10)$$

where:
$I_{FC} = V_o \cdot d$, $S_{TMR}$ = TMR sensitivity,
d = voltage-to-current feedback gain,
$A \cdot S_{TMR}$ = loop gain,
$B_{RF}(x)$ = reflected field as a function of the target's position x,
$K_R(x)$ = reflected field coupling factor, as a function of the target's position x.

The system gain of the magnetic field sensor 300 may accordingly be expressed as:

$$\frac{V_o}{K_R(x)} = \frac{I_{MC} \cdot S_{TMR} \cdot A}{1 + d \cdot K_{FC} \cdot S_{TMR} \cdot A}. \quad (EQ. 11)$$

In example embodiments, feedback coil 346 can be wound in a first direction and the main coil 312 can be wound in a second direction opposite the first direction, facilitating subtraction of the respective magnetic fields when combined as the residual magnetic field. In example embodiments, the first direction may be clockwise. In other example embodiments, the first direction may be counterclockwise. In exemplary embodiments, the feedback coil 346 can be wound in a direction that reduces or minimizes the residual magnetic field 325 at the magneto resistance circuitry 326.

Figure 4:
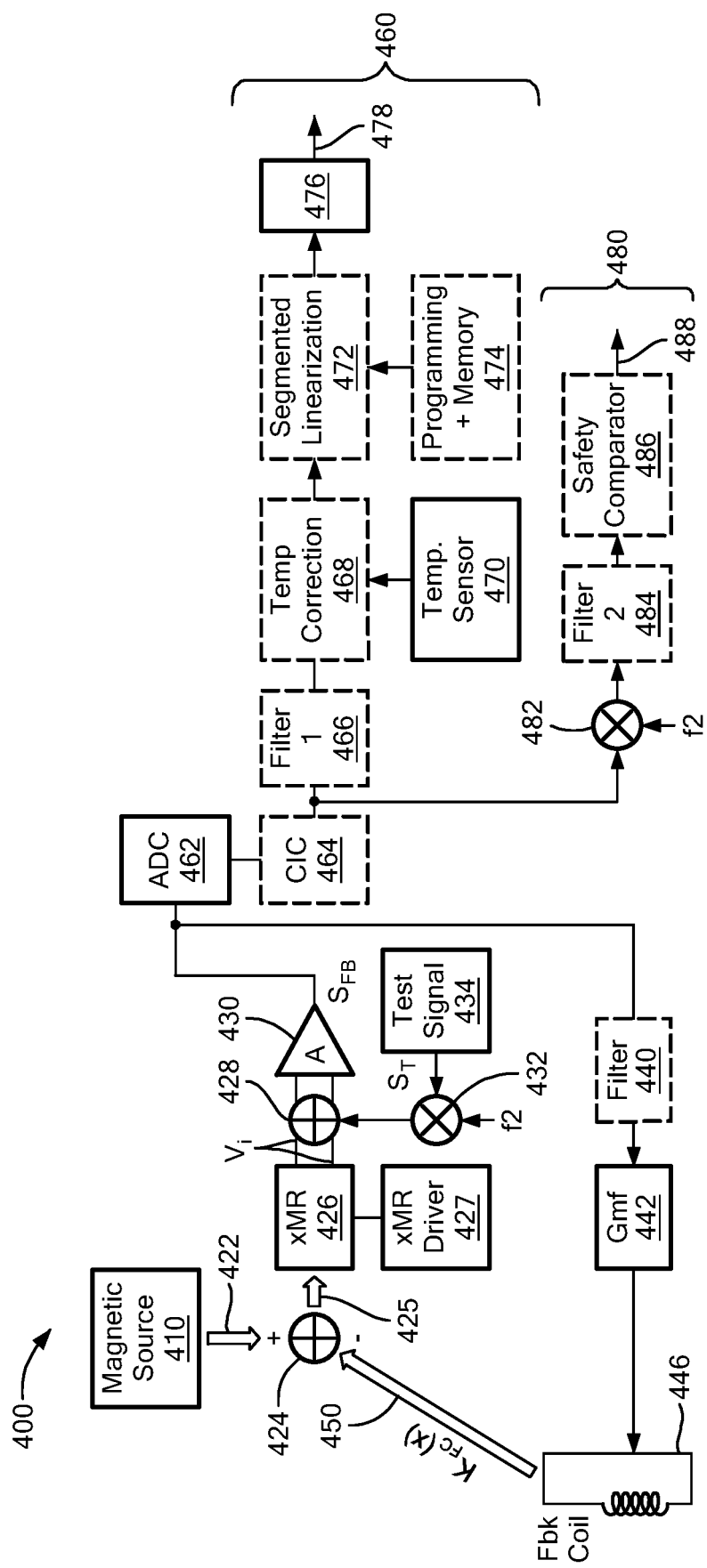
FIG. 4 is a block diagram of an example of an analog closed-loop magnetic-field sensor with out-of-band diagnostic circuitry, in accordance with the present disclosure.

FIG. 4 is a block diagram of an example of a closed-loop magnetic-field sensor 400 having analog loop components, in accordance with the present disclosure. Magnetic-field sensor 400 is shown as generally similar to sensor 200 of FIG. 2 but with analog components in the feedback (closed) loop 420. The magnetic-field sensor 400 includes a magnetic closed loop 420 including magnetoresistance circuitry 426 operative to detect a residual magnetic field 425 including a difference between an applied magnetic field 422, from magnetic source 410, and a feedback magnetic field 450 and produce an electrical output signal. Closed loop 420 can include a driver 427 configured to drive (power) the magnetoresistance circuitry 426, loop amplifier 430 which receives a combined signal from sum unit 428 and produces a feedback signal, feedback circuitry 442, and feedback coil circuitry 446. Closed loop 420 also includes diagnostic signal generation circuitry, indicated by test signal generator 434, which can be modulated by modulator 432 to a desired frequency band ($f_2$) and added to the output electrical signal of the magnetoresistance circuitry 426 by sum unit 428. Closed loop 420 can include a voltage-to-current converter, indicated by transconductance amplifier (GMf) 442, which can drive feedback coil 446 to generate the feedback magnetic field 450. The feedback magnetic field 450 can be combined with the applied magnetic field 422, as shown by 424 to produce residual magnetic field 425.

The sensor 400 can include a main signal path 460 that can process a main signal, e.g., extracted from the feedback signal, and provide a main signal output 478 for the sensor 400. The main signal path 460 can include low pass filter 466, temperature correction circuit 468, a temperature sensor 470, a programming and memory circuit 474, a segmentation and linearization block 472, and an output interface 476, providing main signal output 478. The main signal path 460 may also include digital components, e.g., including ADC 462 and CIC 464. In example embodiments, the main signal output 478 can be indicative of a position or angle relative to the magnetic source 410.

Diagnostic signal path 480 can include demodulator 482, filter 484, and safety comparator 486. Diagnostic signal path 480 can produce an output signal 488 to indicate whether components of the closed feedback loop 420 are functionally correctly or not.

Figure 5:
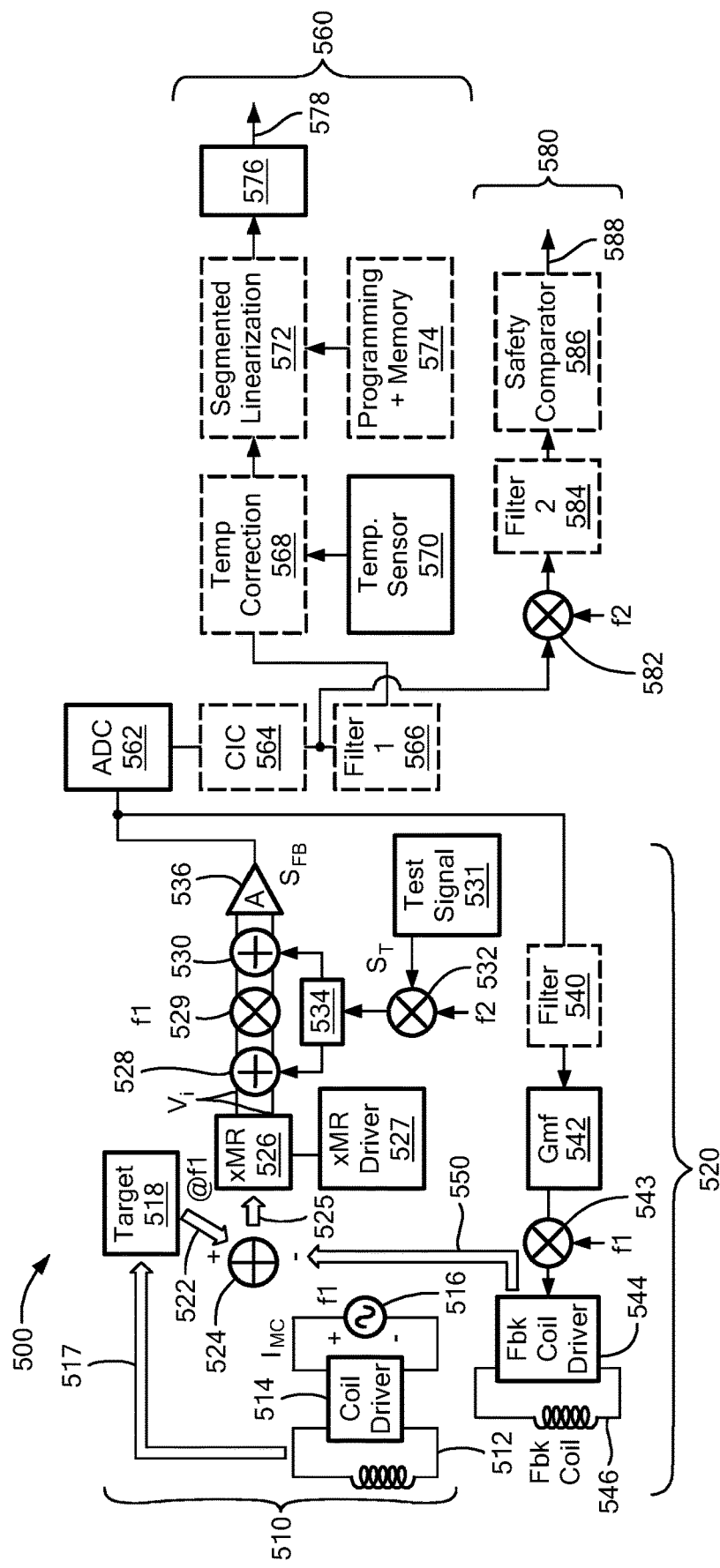
FIG. 5 is a block diagram of a further example of a digital closed-loop magnetic-field sensor with out-of-band diagnostic circuitry, in accordance with the present disclosure.

FIG. 5 is a block diagram of a further example of a closed-loop magnetic-field sensor 500 having analog loop components, in accordance with the present disclosure. Magnetic-field sensor 500 is shown as generally similar to sensor 300 of FIG. 3 but with analog components in the feedback (closed) loop 520. The magnetic-field sensor 500 includes a magnetic closed loop 520 including magnetoresistance circuitry 526 operative to detect a residual magnetic field 525 including a difference between a reflected magnetic field 522, reflected from a target 518, and a feedback magnetic field 550 and produce an electrical output signal. Main coil circuitry 510, including source coil 512, driver 514, and source 516, can be used to generate a main coil (first) magnetic field 517 at a first frequency ($f_1$), which can be directed to and reflected from target 518 to produce the reflected magnetic field 522. Closed loop 520 can include a driver 527 configured to drive (power) the magnetoresistance circuitry 526, loop amplifier 536 which receives a combined signal from sum unit 528 or demodulator 529 and produces a feedback signal ($S_{FB}$), feedback circuitry as indicated by transconductance amplifier (GMf) 542, and feedback coil circuitry 546. Closed loop 520 also includes diagnostic signal generation circuitry, indicated by test signal generator 531, which can be modulated by modulator 532 to a desired frequency band ($f_2$) and added to the output electrical signal of the magnetoresistance circuitry 526 by sum unit 528 or sum unit 530, as selected by switch 534. Closed loop 520 can include filter 540, voltage-to-current converter 542, modulator 543, and feedback coil 546, which is operative to generate the feedback magnetic field 550. The feedback magnetic field 550 can be combined with the reflected magnetic field 522, as shown by 524, to produce residual magnetic field 525.

The sensor 500 can include a main signal path 560 that can process a main signal, e.g., extracted from the feedback signal, and provide a main signal output 578 for the sensor 500. The main signal path 560 can include low pass filter 566, temperature correction circuit 568, a temperature sensor 570, a programming and memory circuit 574, a segmentation and linearization block 572, and an output interface 576, providing main signal output 578. The main signal path 560 may also include digital components, e.g., including ADC 562 and CIC 564. In example embodiments, the main signal output 578 can be indicative of a position or angle relative to the target 518.

Diagnostic signal path 580 can include demodulator 582, filter 584, and safety comparator 586. Diagnostic signal path 580 can produce an output signal 588 to indicate whether components of the closed feedback loop 520 are functionally correctly or not.

Figure 6:
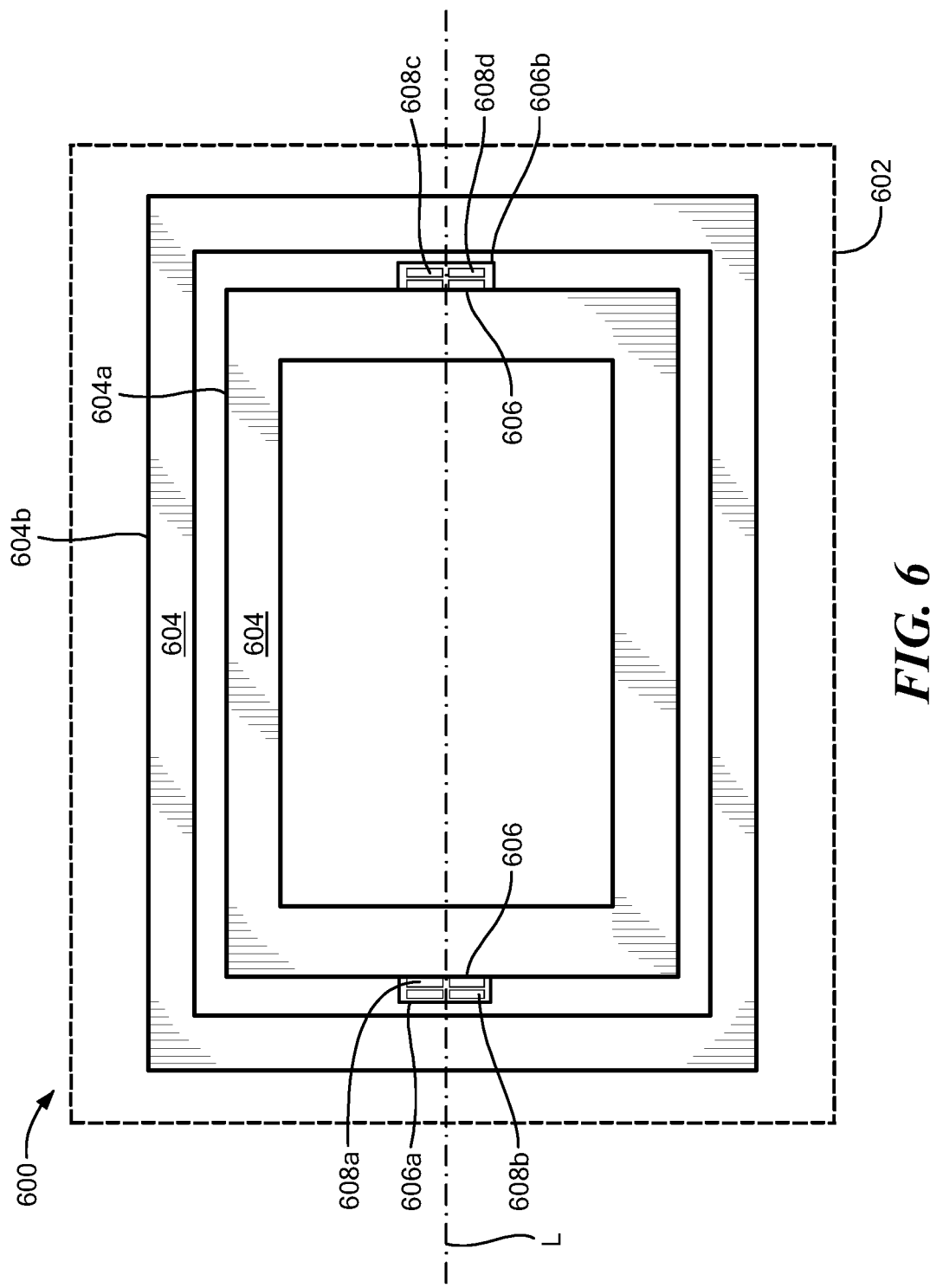
FIG. 6 is a diagram of a coil and magnetoresistance element architecture, in accordance with example embodiments of the present disclosure.

FIG. 6 is a diagram of a coil and magnetoresistance architecture 600, in accordance with example embodiments of the present disclosure. Architecture 600 includes main coil 604, a secondary or feedback coil 606, and magnetoresistance circuitry 608 including magnetoresistance elements 608a-608d in a bridge configuration, e.g., a Wheatstone bridge (bridge connections omitted for clarity). The magnetoresistance elements 608a-608d may be GMR elements and/or TMR elements, in example embodiments. A representative substrate 602, e.g., for supporting elements 604, 606, and 608, is also shown.

Main coil 604 can include inner loops 604a and outer loops 604b, as shown. For simplicity, groupings of individual loops are depicted as inner and outer loops 604a and 604b while the individual loops within the inner loops 604a and the outer loops 604b are not depicted. The magnetoresistance elements 608a-608d may be positioned between the inner loops 604a and the outer loops 604b. In example embodiments, a pair of magnetoresistance elements 608a-608b may be disposed at one end of the main coil 604, relative to a central or longitudinal axis L, and another pair of magnetoresistance elements 608c-608d may be disposed at the other end of the main coil 604.

In example embodiments, the number of inner loops 604a of main coil 604 can differ from the number of outer loops 604b by one or more loops. In other example embodiments, the number of inner loops 604a can be equal to the number of outer loops 604b. In example embodiments, the secondary coil 606, with components 606a-606b, can surround magnetoresistance elements 608a-608b and 608c-608d as shown. The secondary coil 606 can be positioned between the magnetoresistance elements 608a-608b and the main coil 604. In example embodiments, a distance between the secondary coil 606 to the magnetoresistance elements 608a-608d can be smaller than a distance between the main coil 604 to the magnetoresistance elements 608a-608d. In example embodiments, the coupling factor of the secondary coil can be, e.g., about 10 to about 20 times the main coil coupling factor, as the secondary coil 606 can be much closer to the magnetoresistance elements 608a-608d than the main coil 604 is. Accordingly, compensating for any reflected signal can be done efficiently in terms of area consumed on an integrated circuit and/or the amount of power consumed.

As noted previously, the secondary coil 606 can be used to implement magnetic feedback, e.g., as shown and described for sensor 300 of FIG. 3. The secondary coil 606 may implement or have different operational characteristics or parameters than the main coil has, e.g., in terms of area or current consumption, since the secondary coil 606 does not have to emit any field to get reflections, but simply directly couple a field to compensate for reflections. In example embodiments, the secondary coil 606 can have windings opposite in orientation or can have current applied in an opposite direction than as for main coil 604 to facilitate negative feedback, e.g., subtractive combination of a feedback magnetic field and an applied reflected magnetic field. Thus, the secondary coil can be laid out much closer to the magnetic sensing elements, e.g., TMRs, and in standard CMOS metals, potentially achieving higher coupling factors compared to the primary coil. Accordingly, embodiments of the present disclosure can be cost effective, both in terms of area and power consumption. The secondary coil 606 may use, e.g., less than 10-20× current than the main coil 604 to generate the same magnetic signal.

Figure 7:
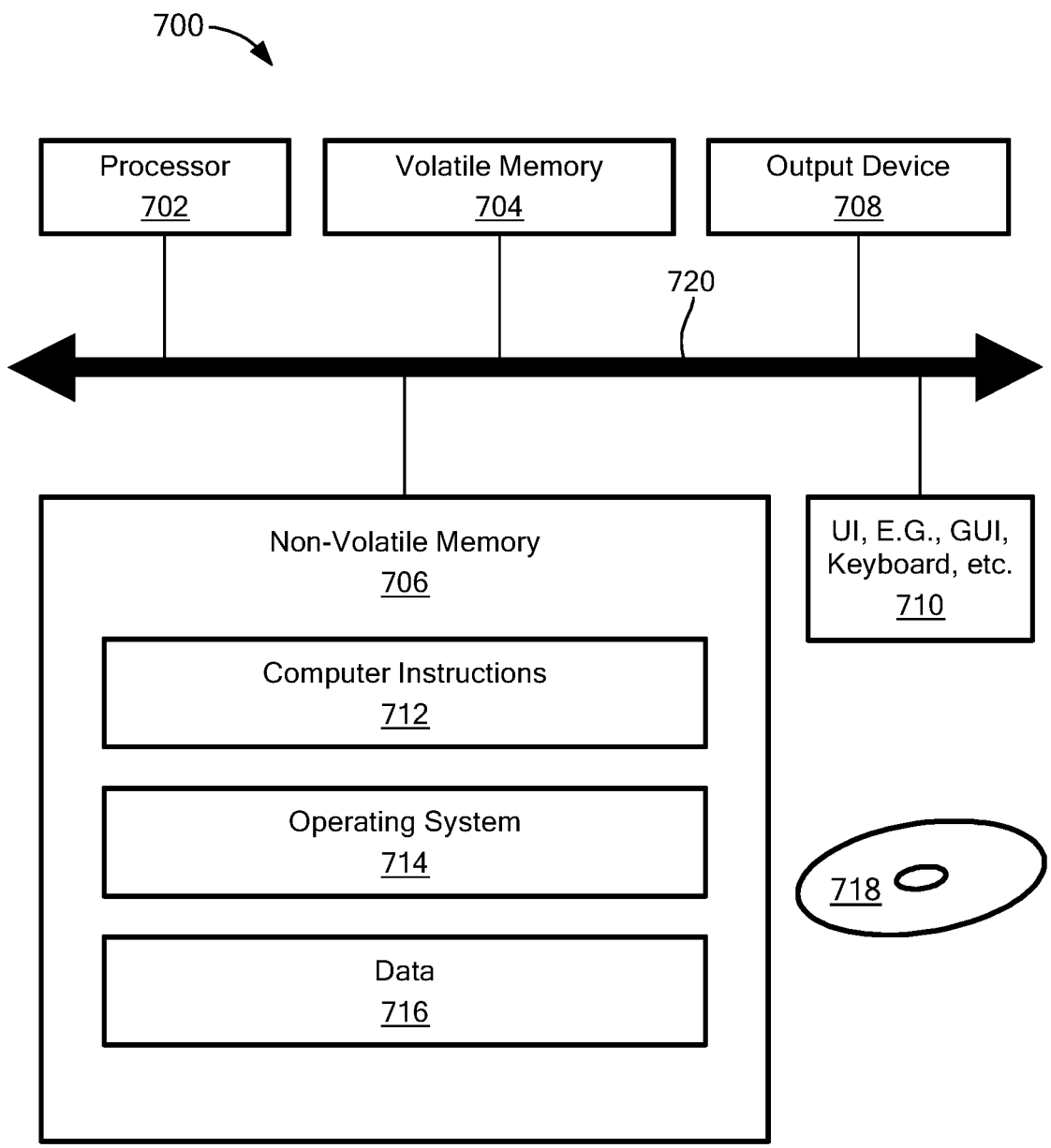
FIG. 7 is a block diagram of an example computer system operative to perform processing, in accordance with the present disclosure.

FIG. 7 is a schematic diagram of an example computer system 700 that can perform all or at least a portion of the processing, e.g., steps in the algorithms and methods, and/or equations (e.g., EQs, 1-11), described herein. The computer system 700 includes a processor 702, a volatile memory 704, a non-volatile memory 706 (e.g., hard disk), an output device 708 and a user input or interface (UI) 710, e.g., graphical user interface (GUI), a mouse, a keyboard, a display, and/or any common user interface, etc. The non-volatile memory (non-transitory storage medium) 706 stores computer instructions 712 (a.k.a., machine-readable instructions or computer-readable instructions) such as software (computer program product), an operating system 714 and data 716. In one example, the computer instructions 712 are executed by the processor 702 out of (from) volatile memory 704. In one embodiment, an article 718 (e.g., a storage device or medium such as a hard disk, an optical disc, magnetic storage tape, optical storage tape, flash drive, etc.) includes or stores the non-transitory computer-readable instructions. Bus 720 is also shown.

Processing may be implemented in hardware, software, or a combination of the two. Processing may be implemented in computer programs (e.g., one or more software applications) executed on programmable computers/machines that each includes a processor, a storage medium or other article of manufacture that is readable by the processor (including volatile and non-volatile memory and/or storage elements), and optionally at least one input device, and one or more output devices. Program code may be applied to data entered using an input device or input connection (e.g., port or bus) to perform processing and to generate output information.

The system 700 can perform processing, at least in part, via a computer program product, (e.g., in a machine-readable storage device), for execution by, or to control the operation of, data processing apparatus (e.g., a programmable processor, a computer, or multiple computers). Each such program may be implemented in a high-level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., CD-ROM, hard disk, or magnetic diskette) that is readable by a general or special purpose programmable computer for configuring and operating the computer when the storage medium or device is read by the computer. Processing may also be implemented as a machine-readable storage medium, configured with a computer program, where upon execution, instructions in the computer program cause the computer to operate. Further, the terms "computer" or "computer system" may include reference to plural like terms, unless expressly stated otherwise.

Processing may be performed by one or more programmable processors executing one or more computer programs to perform the functions of the system. All or part of the system may be implemented as, special purpose logic circuitry, e.g., an FPGA (field programmable gate array) and/or an ASIC (application-specific integrated circuit).

Accordingly, embodiments of the inventive subject matter can afford various benefits relative to prior art techniques. For example, embodiments of the present disclosure can enable or provide systems and components achieving or obtaining an Application Safety Integration Level (ASIL) in accordance with a safety standard such as ISO 26262, e.g., for example meeting a single point failure metric (SPFM) defined in the ASIL context. Embodiments of the present disclosure can provide safety related monitoring for magnetic field sensors, including integrated circuits (ICs), utilizing test signal injection in feedback loops having magnetic field sensing elements. Embodiments of the present disclosure can accordingly provide higher system/component coverage and be more efficient compared to placing different monitoring circuits for each critical block in an associated system. Embodiments of the present disclosure can provide for magnetic sensors by injection of a test or diagnostic signal upfront in the system so that most—if not all—of the signal path is tested. The test signal can continuously run through the channel in order to not overlook a potential failure at some point in time. The diagnostic signal can be magnetically generated so that the transducer operation is covered.

Various embodiments of the concepts, systems, devices, structures, and techniques sought to be protected are described above with reference to the related drawings. Alternative embodiments can be devised without departing from the scope of the concepts, systems, devices, structures, and techniques described. For example, while refence is made above to closed-loops configured to provide negative feedback, other embodiments may utilize loop configurations or architectures providing positive feedback, e.g., with a loop gain of less than 1, may be used within the scope of the present disclosure. While examples of sensitivity values or terms are provided above in terms of TMR elements, other appropriate sensitivity values or terms may be used with respect to other types of magnetic sensing elements. For further example, while reference is made above to use of magnetoresistance elements, other types of magnetic field sensing elements may be used within the scope of the present disclosure.

It is noted that various connections and positional relationships (e.g., over, below, adjacent, etc.) may be used to describe elements in the description and drawing. These connections and/or positional relationships, unless specified otherwise, can be direct or indirect, and the described concepts, systems, devices, structures, and techniques are not intended to be limiting in this respect. Accordingly, a coupling of entities can refer to either a direct or an indirect coupling, and a positional relationship between entities can be a direct or indirect positional relationship.

As an example of an indirect positional relationship, positioning element "A" over element "B" can include situations in which one or more intermediate elements (e.g., element "C") is between elements "A" and "B" as long as the relevant characteristics and functionalities of elements "A" and "B" are not substantially changed by the intermediate element(s).

Also, the following definitions and abbreviations are to be used for the interpretation of the claims and the specification. The terms "comprise," "comprises," "comprising, "include," "includes," "including," "has," "having," "contains" or "containing," or any other variation are intended to cover a non-exclusive inclusion. For example, an apparatus, a method, a composition, a mixture, or an article, that includes a list of elements is not necessarily limited to only those elements but can include other elements not expressly listed or inherent to such apparatus, method, composition, mixture, or article.

Additionally, the term "exemplary" means "serving as an example, instance, or illustration. Any embodiment or design described as "exemplary" is not necessarily to be construed as preferred or advantageous over other embodiments or designs. The terms "one or more" and "at least one" indicate any integer number greater than or equal to one, i.e., one, two, three, four, etc. The term "plurality" indicates any integer number greater than one. The term "connection" can include an indirect "connection" and a direct "connection".

References in the specification to "embodiments," "one embodiment," "an embodiment," "an example embodiment," "an example," "an instance," "an aspect," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it may affect such feature, structure, or characteristic in other embodiments whether explicitly described or not.

Relative or positional terms including, but not limited to, the terms "upper," "lower," "right," "left," "vertical," "horizontal, "top," "bottom," and derivatives of those terms relate to the described structures and methods as oriented in the drawing figures. The terms "overlying," "atop," "on top, "positioned on" or "positioned atop" mean that a first element, such as a first structure, is present on a second element, such as a second structure, where intervening elements such as an interface structure can be present between the first element and the second element. The term "direct contact" means that a first element, such as a first structure, and a second element, such as a second structure, are connected without any intermediary elements.

Use of ordinal terms such as "first," "second," "third," etc., in the claims to modify a claim element does not by itself connote any priority, precedence, or order of one claim element over another, or a temporal order in which acts of a method are performed, but are used merely as labels to distinguish one claim element having a certain name from another element having a same name (but for use of the ordinal term) to distinguish the claim elements.

The terms "approximately" and "about" may be used to mean within ±20% of a target value in some embodiments, within plus or minus (±) 10% of a target value in some embodiments, within ±5% of a target value in some embodiments, and yet within ±2% of a target value in some embodiments. The terms "approximately" and "about" may include the target value. The term "substantially equal" may be used to refer to values that are within ±20% of one another in some embodiments, within ±10% of one another in some embodiments, within ±5% of one another in some embodiments, and yet within ±2% of one another in some embodiments.

The term "substantially" may be used to refer to values that are within ±20% of a comparative measure in some embodiments, within ±10% in some embodiments, within ±5% in some embodiments, and yet within ±2% in some embodiments. For example, a first direction that is "substantially" perpendicular to a second direction may refer to a first direction that is within ±20% of making a 90° angle with the second direction in some embodiments, within ±10% of making a 90° angle with the second direction in some embodiments, within ±5% of making a 90° angle with the second direction in some embodiments, and yet within ±2% of making a 90° angle with the second direction in some embodiments.

The disclosed subject matter is not limited in its application to the details of construction and to the arrangements of the components set forth in the following description or illustrated in the drawings. The disclosed subject matter is capable of other embodiments and of being practiced and carried out in various ways.

Also, the phraseology and terminology used in this patent are for the purpose of description and should not be regarded as limiting. As such, the conception upon which this disclosure is based may readily be utilized as a basis for the designing of other structures, methods, and systems for carrying out the several purposes of the disclosed subject matter. Therefore, the claims should be regarded as including such equivalent constructions as far as they do not depart from the spirit and scope of the disclosed subject matter.

Although the disclosed subject matter has been described and illustrated in the foregoing exemplary embodiments, the present disclosure has been made only by way of example. Thus, numerous changes in the details of implementation of the disclosed subject matter may be made without departing from the spirit and scope of the disclosed subject matter.

Accordingly, the scope of this patent should not be limited to the described implementations but rather should be limited only by the spirit and scope of the following claims.

All publications and references cited in this patent are expressly incorporated by reference in their entirety.

What is claimed is:

1. A magnetic field sensor comprising:
   magnetoresistance circuitry configured to receive a residual magnetic field including a difference between an applied magnetic field produced by a magnetic source at a first frequency and a feedback magnetic field and produce an electrical output signal;
   diagnostic signal generation circuitry configured to generate a diagnostic signal at a second frequency and combine the diagnostic signal with the output signal from the magnetoresistance circuitry to generate a combined signal, wherein the combined signal includes the diagnostic signal and main signal components;
   feedback circuitry coupled to the magnetoresistance circuitry and configured to receive the combined signal, wherein the feedback circuitry is configured to produce a feedback signal based on the combined signal;
   feedback coil circuitry including a feedback coil configured to receive the feedback signal and operative to generate the feedback magnetic field; and
   diagnostic processing circuitry configured to extract the diagnostic signal from the combined signal and produce an error indication when the extracted diagnostic signal is outside of a normal-operation range.

2. The magnetic field sensor of claim 1, wherein the feedback magnetic field includes a scaled replica of the applied magnetic field.

3. The magnetic field sensor of claim 1, wherein an amplitude of the residual magnetic field is within a linearity range of the magnetoresistance circuitry.

4. The magnetic field sensor of claim 1, wherein the feedback circuitry comprises an amplifier operative to amplify the combined signal.

5. The magnetic field sensor of claim 1, wherein the feedback circuitry comprises a transconductance amplifier configured to drive the feedback coil.

6. The magnetic field sensor of claim 1, wherein the magnetoresistance circuitry comprises a plurality of magnetoresistance elements configured as a bridge.

7. The magnetic field sensor of claim 6, wherein the bridge comprises one or more tunneling magnetoresistance (TMR) elements.

8. The magnetic field sensor of claim 6, wherein the bridge comprises one or more giant magnetoresistance (GMR) elements.

9. The magnetic field sensor of claim 1, further comprising main processing circuitry operative to extract a main signal from the feedback signal and produce an output signal based on the main signal.

10. The magnetic field sensor of claim 9, wherein the output signal is indicative of a position of the magnetic source.

11. The magnetic field sensor of claim 1, wherein the first frequency comprises a baseband frequency in a range between DC and 20 kHz.

12. The magnetic field sensor of claim 1, wherein the second frequency is between about 20 kHz and about 50 kHz.

13. The magnetic field sensor of claim 1, wherein the diagnostic processing circuitry includes a comparator configured to compare the extracted diagnostic signal to one or more values representing normal operation of the sensor.

14. The magnetic field sensor of claim 1, wherein the feedback circuitry and feedback coil are configured as a closed-loop configured to provide the feedback magnetic field to the magnetoresistance circuitry.

15. A magnetic field sensor comprising:
    main coil circuitry configured to generate a magnetic field at a first frequency for reflection off of a target, wherein in response to the magnetic field, a reflected magnetic field is generated from the target;
    magnetoresistance circuitry configured to receive a residual magnetic field including a difference between the reflected magnetic field and a feedback magnetic field and produce an electrical output signal;
    diagnostic signal generation circuitry configured to generate a diagnostic signal at a second frequency and combine the diagnostic signal with the output signal from the magnetoresistance circuitry to generate a combined signal, wherein the combined signal includes diagnostic signal and main signal components;
    feedback circuitry coupled to the magnetoresistance circuitry and configured to receive the combined signal, wherein the feedback circuitry is configured to produce a feedback signal based on the combined signal;
    feedback coil circuitry including a feedback coil configured to receive the combined signal and operative to generate the feedback magnetic field; and
    diagnostic processing circuitry configured to extract the diagnostic signal from the combined signal and produce an error indication when the extracted diagnostic signal is outside of a normal-operation range.

16. The magnetic field sensor of claim 15, wherein the feedback magnetic field includes a scaled replica of the reflected magnetic field.

17. The magnetic field sensor of claim 15, wherein an amplitude of the residual magnetic field is within a linearity range of the magnetoresistance circuitry.

18. The magnetic field sensor of claim 15, wherein main coil circuitry includes a main coil and the feedback coil is configured relative to the main coil to generate the residual magnetic field as the difference between the reflected magnetic field and the feedback magnetic field at the magnetoresistance circuitry.

19. The magnetic field sensor of claim 15, wherein the feedback circuitry comprises a first demodulator operative to receive the electrical output signal from the magnetoresistance circuitry and demodulate the electrical output signal by the first frequency to a baseband signal.

20. The magnetic field sensor of claim 19, wherein the feedback circuitry comprises an amplifier operative to amplify the combined signal.

21. The magnetic field sensor of claim 15, wherein the feedback circuitry comprises a transconductance amplifier configured to drive the feedback coil.

22. The magnetic field sensor of claim 21, wherein the feedback circuitry further comprises a modulator operative to modulate the feedback signal with the first frequency.

23. The magnetic field sensor of claim 15, wherein the magnetoresistance circuitry comprises a bridge including a plurality of magnetoresistance elements.

24. The magnetic field sensor of claim 23, wherein the bridge comprises one or more tunneling magnetoresistance (TMR) elements.

25. The magnetic field sensor of claim 23, wherein the bridge comprises one or more giant magnetoresistance (GMR) elements.

26. The magnetic field sensor of claim 15, further comprising main processing circuitry operative to extract a main signal from the feedback signal and produce an output signal based on the main signal.

27. The magnetic field sensor of claim 26, wherein the output signal is indicative of a position of the target.

28. The magnetic field sensor of claim 15, wherein the first frequency is between about 1 MHz and about 10 MHz.

29. The magnetic field sensor of claim 15, wherein the second frequency is between about 20 kHz and about 50 kHz.

30. The magnetic field sensor of claim 15, wherein the diagnostic processing circuitry includes a comparator configured to compare the extracted diagnostic signal to one or more values representing normal operation of the sensor.

31. The magnetic field sensor of claim 19, wherein the diagnostic processing circuitry includes a second demodulator operative to demodulate the feedback signal with the second frequency.

32. The magnetic field sensor of claim 23, wherein the main coil circuitry comprises a main coil having inner and outer loops, and wherein the bridge includes two pairs of magnetoresistance elements, each pair disposed between the inner and outer loops at opposing positions relative to a central axis of the main coil.

33. The magnetic field sensor of claim 32, wherein the feedback coil comprises two feedback coils, each disposed around a respective pair of magnetoresistance elements.

34. The magnetic field sensor of claim 19, wherein the diagnostic signal generation circuitry is configured to combine the diagnostic signal with the output signal from the magnetoresistance circuitry at the first frequency and at a location between the magnetoresistance circuitry and the first demodulator.

35. The magnetic field sensor of claim 20, wherein the diagnostic signal generation circuitry is configured to combine the diagnostic signal with the output signal from the magnetoresistance circuitry at a location between the first demodulator and the amplifier.

36. The magnetic field sensor of claim 15, wherein the feedback circuitry and feedback coil are configured as a closed-loop configured to provide the feedback magnetic field to the magnetoresistance circuitry.

\* \* \* \* \*

UNITED STATES PATENT AND TRADEMARK OFFICE
CERTIFICATE OF CORRECTION

PATENT NO. : 11,927,650 B2
APPLICATION NO. : 17/659515
DATED : March 12, 2024
INVENTOR(S) : Hernán D. Romero Page 1 of 1

It is certified that error appears in the above-identified patent and that said Letters Patent is hereby corrected as shown below:

In the Specification

Column 10, Line 8, delete "$K_{SC}\ S_{TMR}$" and replace with --$K_{SC} \cdot S_{TMR}$--.

Column 12, Line 7, delete "sensing elements 326" and replace with --magnetoresistance circuitry 326--.

Column 16, Line 10-11, delete "by 424" and replace with --by sum unit 424--.

Column 16, Line 60, delete "by 524" and replace with --by sum unit 524--.

Signed and Sealed this
Eighteenth Day of February, 2025

Coke Morgan Stewart
*Acting Director of the United States Patent and Trademark Office*